United States Patent
Konz

(10) Patent No.: US 8,749,992 B2
(45) Date of Patent: Jun. 10, 2014

(54) ELECTRONIC COMPONENT

(75) Inventor: Oliver Konz, Ilshofen (DE)

(73) Assignee: Wuerth Elektronik iBE GmbH, Thyrnau (DE)

( * ) Notice: Subject to any disclaimer, the term of this patent is extended or adjusted under 35 U.S.C. 154(b) by 698 days.

(21) Appl. No.: 12/999,772

(22) PCT Filed: Jun. 16, 2009

(86) PCT No.: PCT/EP2009/057433
§ 371 (c)(1),
(2), (4) Date: Dec. 17, 2010

(87) PCT Pub. No.: WO2009/156298
PCT Pub. Date: Dec. 30, 2009

(65) Prior Publication Data
US 2011/0102990 A1 May 5, 2011

(30) Foreign Application Priority Data

Jun. 24, 2008 (DE) .......................... 10 2008 030 631

(51) Int. Cl.
| H05K 7/02 | (2006.01) |
|---|---|
| H05K 7/04 | (2006.01) |
| H05K 13/04 | (2006.01) |
| H01H 50/12 | (2006.01) |
| H05K 3/30 | (2006.01) |

(52) U.S. Cl.
CPC ........... H05K 13/0408 (2013.01); H01H 50/12 (2013.01); H05K 3/301 (2013.01); Y10S 439/94 (2013.01)
USPC ............................ 361/807; 336/205; 439/940

(58) Field of Classification Search
CPC ..... H01F 40/04; H01F 27/327; H01F 41/127; H01R 43/20; H01R 43/25; H01K 13/0404; H01K 13/0408; H01K 3/301
USPC ................ 361/679.01; 336/205, 221; 439/940
IPC ........ H01F 40/04, 27/327, 41/127; H01R 43/20, H01R 43/25; H01K 13/0404, 13/0408, 3/301
See application file for complete search history.

(56) References Cited

U.S. PATENT DOCUMENTS

| 5,277,601 A | 1/1994 | Miyazawa |
| 5,688,133 A | 11/1997 | Ikesugi et al. |
| 6,152,144 A | 11/2000 | Lesh et al. |
| 6,189,286 B1 | 2/2001 | Seible et al. |
| 6,433,280 B2 | 8/2002 | Winterer et al. |
| 6,727,792 B2 * | 4/2004 | Amada et al. ................. 336/192 |

(Continued)

FOREIGN PATENT DOCUMENTS

DE          298 04 135 U1     4/1998

*Primary Examiner* — Bernard Rojas
(74) *Attorney, Agent, or Firm* — Boyle Fredrickson, S. C.

(57) ABSTRACT

For automatic attachment of electronic components onto circuit boards, it is proposed that the electronic component be provided with a holding element that comprises a gripping point for a suction gripper. The holding element is designed as a clip that can be connected to the electronic component. The connecting occurs preferably by a snap-on action, wherein a form fit or positive fit is achieved by the shape of the clip, which is made of plastic. Preferably, the clip comprises a rib on the inside thereof facing the electronic component, said rib extending over at least half the periphery and engaging in a gap in the surface of the electronic component. If the electronic component is a coil, the rib, which is directed inward, can run along a helical line.

12 Claims, 2 Drawing Sheets

(56) References Cited

U.S. PATENT DOCUMENTS

| | | | |
|---|---|---|---|
| 7,393,219 B2* | 7/2008 | Liao | 439/135 |
| 7,973,634 B2* | 7/2011 | Aumueller | 336/205 |
| 2001/0004230 A1* | 6/2001 | Thibado | 336/208 |
| 2004/0102105 A1 | 5/2004 | Steiner et al. | |
| 2008/0312605 A1 | 12/2008 | Saiki | |
| 2009/0058590 A1 | 3/2009 | Aumueller | |
| 2012/0232517 A1 | 9/2012 | Saiki | |

* cited by examiner

ELECTRONIC COMPONENT

The invention relates to fitting electronic components on printed circuit boards. Electronic components are mounted on printed circuit boards, for example in surface mounted devices, in automated processes. Grippers which engage on the components by virtue of a suction action are used in order to move said components to the correction position. High speeds and the associated accelerations are often used to move said components to their correct position. However, many electronic components, for example coils, do not have any points at which a gripper can engage with a suction action.

To date, it has already been proposed (DE 10 2005 022927 A1) to injection mold a holding element, which is composed of plastic and forms an engagement point for a gripper, on an electronic component, for example a coil.

Also known is a rod core coil in the case of which an elastic plastics clip is placed on the winding, said clip extending over the majority of the winding in the longitudinal direction of the coil. The clip has a smooth inner face and, on its outer face, a flat engagement surface for a gripper (DE 29804135 U1). There are no means between the clip and the coil for securing the coil in the longitudinal direction.

The invention is based on the object of providing a further possible way of being able to form an electronic component in such a way that it is particularly suitable for being automatically mounted on printed circuit boards with the aid of grippers.

In order to achieve this object, the invention proposes an electronic component having the features cited in claim 1. Developments of the invention are the subject matter of dependent claims.

The holding element also makes it possible for electronic components which do not have a defined engagement point for a gripper to be positioned by grippers. In this case, the gripper engages on the engagement point of the holding element.

Provision may be made, in particular, for the holding element to be in the form of a clip which can snap onto the electronic component.

The engagement point for the gripper provided, which usually operates with a suction action, may be a plate element which has, in particular, a flat surface.

In a development, the holding element, which is in the form of a clip, can have two limbs which run approximately parallel and are formed such that, when the holding element is connected to the electronic component, said limbs enclose the component. The two limbs can have a certain degree of prestress in this case, so that they are fixed to the component in a clamping manner.

In addition to the clamping action, provision may also be made for the two limbs to form an interlocking connection in the engagement direction of the gripper.

A holding element of this kind is particularly suitable when the electronic component is a coil which, on account of the use of winding wire with a round cross section, does not form an engagement surface for a suction gripper.

In order to form an interlocking connection here, provision may be made for the two limbs of the holding element to reach beyond the center plane of the coil, that is to say to a point at which the distance between the two limbs has again become smaller than in the center plane itself.

In a development, provision may be made for the coil to have a coil core, and for the holding element to engage both on the coil core and on at least one turn of the coil winding. This should have the result that, when the electronic component moves backward, the coil cannot become detached from the coil core.

In a further development of the invention, provision may be made for the holding element to have a rib on its inner face which faces the component. This rib can, in particular, also be formed on the two limbs. In this way, it is possible for the rib to engage in a recess between two wire turns, so that there is also an interlocking connection in the axial direction of a coil.

Provision may be made for the rib to extend over more than half the periphery. In this way, said rib can also be involved in the interlocking connection.

In a further development of the invention, provision may be made for the rib to extend along a helical line. In this way, said rib can engage between two wire turns over half or more of the periphery too. In this case, provision may be made, in particular, for the rib to reach the coil core. In this way, said rib can also form an interlocking connection for the coil core.

The invention likewise proposes a holding element in the form of a clip, to be fitted on an electronic component.

Further features, details and preferences of the invention can be gathered from the claims and the abstract, the wording of said claims and abstract being included in the description by reference, the following description of preferred embodiments of the invention and also with reference to the drawing, in which:

Figure 1:
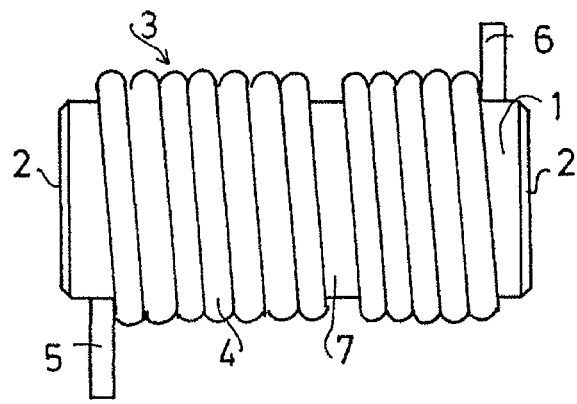
FIG. 1 shows a plan view of an electronic component in the form of a coil.

FIG. 1 shows, as an example of an electronic component, a coil having a coil core 1, for example composed of ferrite. The coil core 1 is in the form of a circular-cylindrical rod. It could also have a different cross section. The rod contains two flat end faces 2. The coil core 1 is surrounded by a coil winding 3 which has a large number of coil turns 4 which bear one against the other. The two ends 5, 6 of the coil winding 3 are guided tangentially away from the coil core 1. The two ends could also be longer; the illustration is only intended to be schematic. Said two ends lie in one plane. This plane represents the mounting side of the coil.

The turns 4 of the coil winding 3 are wound at a point 7 such that, there, they are at a distance from each other in the longitudinal direction of the coil. As a result, a gap is formed, a portion of the surface of the coil core 1 being visible through said gap.

Since an electronic component of this kind could be grasped by a suction gripper only with difficulty if the flat end faces 2 are not present, the invention proposes fitting a holding element 8 (illustrated in FIG. 2 to FIG. 4) to the electronic component. This holding element is in the form of a clip and can be snapped onto the coil of FIG. 1 transverse to the longitudinal axis of said coil. The holding element contains a central section 9 which corresponds approximately to a portion of cylindrical casing which has an inner shape 10 which corresponds to the outer shape of the electronic component. In the illustrated example with a coil which is wound around a circular-cylindrical core 1, the inner shape of the section 9 is therefore likewise circular-cylindrical. In the side view of FIG. 2, the section 9 extends over approximately ¾ of an arc of a circle. As a result, the holding element forms two limbs 11 which, when snapped onto a cylindrical body in a clamping manner, lie firmly against said body and also form an interlocking connection.

Figure 3:
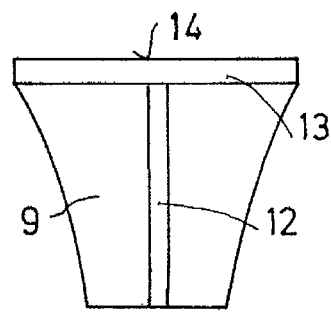
FIG. 3 shows the view of the holding element of FIG. 2 from the right in FIG. 2.

For reinforcement purposes, the two limbs 11 have crosspieces 12 on the outside of the casing section 9, said crosspieces being arranged centrally between the two ends, as can be gathered from FIG. 3.

A plate element 13 is integrally formed on the holding element on that side of said holding element which is opposite the open end between the ends of the two limbs 11. This plate element is circular and contains a flat surface 14 which can serve as an engagement point for a suction gripper. The engagement point is situated on that side of the holding element 8 which is averted from the intermediate space between the two limbs 11.

An inwardly directed rib 15 runs between the limbs 11 on the inner face of the casing section 9. Said rib extends over approximately ¾ of an arc of a circle, similarly to the two limbs 11. This rib 15 has such a radial extent that the diameter between its inner edge 16 is approximately identical to the outside diameter of the coil core 1.

Figure 2:
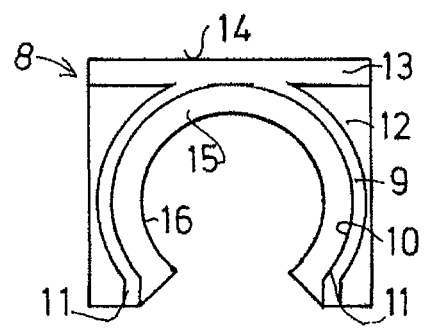
FIG. 2 shows the axial view of a holding element.
Figure 4:
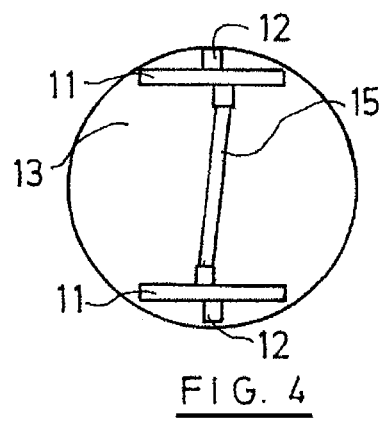
FIG. 4 shows the view of the holding element in FIG. 2 and FIG. 3 from below.
Figure 5:
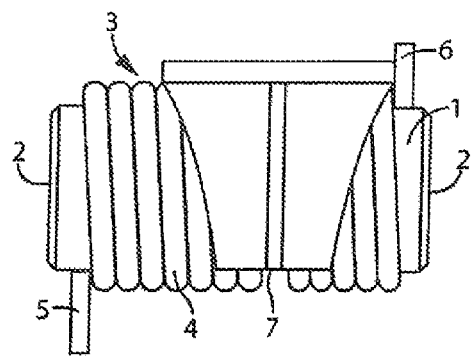
FIG. 5 shows the holding element of FIG. 3 snapped on the coil of FIGS. 1.
Figure 6:
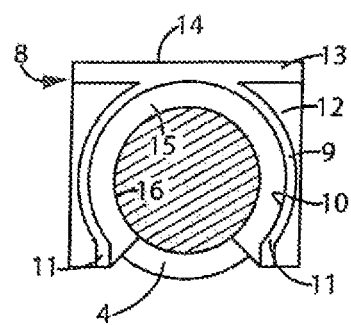
FIG. 6 shows the holding element of FIG. 2 snapped on the coil element with the core shown in cross section and on coil winding in view.

FIG. 4 shows a view of the holding element in FIG. 2 and FIG. 3 from below. It can be seen from said FIG. 4 that the rib 15 which is formed on the inner face of the casing section 9 runs along a helical line. Therefore, said rib can engage between two turns 4 of the coil winding 3, so that the inner edge 16 can come to rest against the surface of the coil core 1.

Since both the inner rib 15 and the casing section 9 extend over more than half an arc of a circle, the holding element forms an interlocking connection which acts in the pull-out direction both on the coil core 1 and on the coil winding 3 when it is snapped onto the coil of FIG. 1. The interlocking connection on the coil core 1 is established by the inner rib 15, while the interlocking connection on the coil winding 4 is established by the casing section 9. In this case, the pull-out direction runs perpendicular to the surface 14 of the plate element 13. At the same time, the inner rib 15 forms an interlocking connection in the axial direction.

The invention claimed is:

1. An electronic component, which
   is designed for automatic mounting and
   has a holding element, which
   has an engagement point for an automatic gripper and
   is connected at least in a force-fitting manner to the electronic component in the engagement direction of the gripper,
   in the form of a coil with a coil winding and at least two connection ends,
   wherein the coil has a coil core, and the holding element engages both on the coil core and on at least one turn of the coil winding.

2. The component as claimed in claim 1, wherein the holding element is in the form of a clip which can snap onto the component.

3. The component as claimed in claim 1, wherein the holding element forms an interlocking connection on the coil core and on the coil turn.

4. The component as claimed in claim 2, wherein the holding element has a rib on its inner face which faces the component.

5. The component as claimed in claim 4, wherein the rib extends over more than half the periphery of the holding element.

6. The component as claimed in claim 4, wherein the rib extends along a helical line.

7. The component as claimed in claim 6, wherein the rib reaches the coil core.

8. The component as claimed in claim 1, wherein the engagement point for the gripper has an, in particular flat, plate element.

9. The component as claimed in claim 1, wherein the holding element has two limbs which enclose the component and are fixed to the component in a clamping manner.

10. The component as claimed in claim 9, wherein the two limbs form an interlocking connection to the electronic component in the engagement direction of the gripper.

11. The component as claimed in claim 1, wherein the limbs of the holding element reach beyond the center plane of the coil.

12. An electronic component, which
   is designed for automatic mounting and
   has a holding element, which
   has an engagement point for an automatic gripper and
   is connected at least in a force-fitting manner to the electronic component in the engagement direction of the gripper,
   wherein the holding element is in the form of a clip which can snap onto the component,
   further wherein the holding element has a rib on its inner face which faces the component, and
   further wherein the rib extends along a helical line.

* * * * *